(12) United States Patent
Lekatsas et al.

(10) Patent No.: US 7,302,543 B2
(45) Date of Patent: Nov. 27, 2007

(54) COMPRESSED MEMORY ARCHITECTURE FOR EMBEDDED SYSTEMS

(75) Inventors: Haris Lekatsas, Princeton, NJ (US); Joerg Henkel, Exton, PA (US); Srimat Chakradhar, Manalapan, NJ (US); Venkata Jakkula, Monmouth Junction, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 315 days.

(21) Appl. No.: 10/869,985

(22) Filed: Jun. 16, 2004

(65) Prior Publication Data

US 2006/0101223 A1    May 11, 2006

(51) Int. Cl.
*G06F 12/00* (2006.01)

(52) U.S. Cl. .................. 711/170; 711/171; 710/68

(58) Field of Classification Search .............. None
See application file for complete search history.

(56) References Cited

U.S. PATENT DOCUMENTS

| | | | |
|---|---|---|---|
| 5,057,837 A | 10/1991 | Colwell et al. | |
| 5,386,469 A | 1/1995 | Yearsley et al. | |
| 5,455,576 A | 10/1995 | Clark, II et al. | |
| 5,761,536 A | 6/1998 | Franaszek | |
| 5,764,994 A | 6/1998 | Craft | |
| 5,812,817 A | 9/1998 | Hovis et al. | |
| 5,825,878 A | 10/1998 | Takahashi et al. | |
| 5,920,723 A | 7/1999 | Peyton, Jr. et al. | |
| 5,999,189 A | 12/1999 | Kajiya et al. | |
| 6,145,069 A * | 11/2000 | Dye | 711/170 |
| 6,173,381 B1 * | 1/2001 | Dye | 711/170 |
| 6,175,896 B1 | 1/2001 | Bui | |
| 6,195,743 B1 | 2/2001 | Elnozahy | |
| 6,202,152 B1 | 3/2001 | Yuenyongsgool et al. | |
| 6,208,273 B1 * | 3/2001 | Dye et al. | 341/51 |
| 6,233,674 B1 | 5/2001 | Elnozahy | |
| 6,240,419 B1 | 5/2001 | Franaszek | |
| 6,442,680 B1 | 8/2002 | Elnozahy | |
| 6,819,271 B2 | 11/2004 | Geiger et al. | |
| 6,822,589 B1 * | 11/2004 | Dye et al. | 341/51 |
| 6,879,266 B1 * | 4/2005 | Dye et al. | 341/51 |
| 2001/0054131 A1 * | 12/2001 | Alvarez et al. | 711/105 |
| 2002/0091905 A1 * | 7/2002 | Geiger at al. | 711/170 |
| 2005/0246506 A1 * | 11/2005 | Ukai | 711/152 |

OTHER PUBLICATIONS

M. Kjelso et al., "Design & Performance of a Main Memory Hardware Data Compressor", 22nd Euromicro Conference, IEEE Computer Society Press, Sep. 1996.
R.B. Tremaine et al., "IBM Memory Expansion Technology (MXT)", IBM J. Res. & Dev., vol. 45, No. 2, Mar. 2001.
L. Benini et al., "Selective Instruction Compression for Memory Energy Reduction in Embedded Systems", IEEE ISLPED—Aug. 1999.
H. Lekatsas et al., "Design of an One-Cycle Decompression Hardware for Performance Increase in Embedded Systems", DAC Jun. 2002.

(Continued)

*Primary Examiner*—Reginald Bragdon
*Assistant Examiner*—Ngoc Dinh (57) ABSTRACT

An embedded systems architecture is disclosed which can flexibly handle compression of both instruction code and data.

11 Claims, 4 Drawing Sheets

OTHER PUBLICATIONS

H. Lekatsas et al., "SAMC: A Code Compression Algorithm for Embedded Processors", IEEE Transactions on Computer-Aided Design of Integrated Circuits and Systems, Dec. 1999.

S. Ravi et al., "Tamper Resistance Mechanisms for Secure Embedded Systems", Proceedings of the 17th International Conference on VLSI Design, Jan. 2004.

L. Benini et al., "Minimizing Memory Access Energy in Embedded Systems by Selective Instruction Compression", IEEE Transactions on Very Large Scale Integration, Oct. 2002.

H. Lekatsas et al., "Code Compression for Embedded Systems", DAC Jun. 1998.

H. Lekatsas et al., "Code Compression as a Variable in Hardware/Software Co-Design", C&C Technical Report No. 2000-C020-4-5110-2, Feb. 2000.

C. Shaw et al., "A Pipeline Architecture for Encompression (Encryption+Compression) Technology", Proceedins of the 16th International Conference on VLSI Design, 2003.

G.E. Suh et al., "Efficient Memory Integrity Verification and Encryption for Secure Processors", Proceedings of the 36th International Symposium on Microarchitecture, 2003.

N. Provos, "Encrypting Virtual Memory", Proceedings of the 9th Usenix Security Symposium, Aug. 2000.

* cited by examiner

COMPRESSED MEMORY ARCHITECTURE FOR EMBEDDED SYSTEMS

RELATED APPLICATIONS

The present application is related to co-pending commonly-assigned U.S. utility patent applications "DYNAMIC CONTENT-AWARE MEMORY COMPRESSION AND ENCRYPTION ARCHITECTURE," Ser. No. 10/869,984, and "MEMORY ENCRYPTION ARCHITECTURE," Ser. No. 10,869,983, both filed contemporaneously with the present application on Jun. 16, 2004 and both of which are incorporated by reference herein.

BACKGROUND OF THE INVENTION

The present invention is related to memory architectures and, more particularly, to architectures for compression of memory in embedded systems.

Compression techniques are well-known. A recent development has been to use compression techniques to reduce the size of main memory in a computer architecture. See, e.g., M. Kjelso et al., "Main Memory Hardware Data Compression," $22^{nd}$ Euromicro Conference, pages 423-30, IEEE Computer Society Press (September 1996). For example, researchers at IBM have developed the "MXT" architecture for servers which performs compression and decompression during runtime of an application when transferring data from the L3 cache to main memory and vice versa. See Tremaine et al., "IBM Memory Expansion Technolog (MXT)," IBM J. Res. & Dev., Vol. 45, No. 2 (March 2001). See also U.S. Pat. Nos. 5,761,536, 5,812,817, and 6,240,419, which are incorporated by reference herein.

Current trends in embedded systems design require complex functionality while keeping hardware size small. As devices such as cellular phones and digital cameras get smaller and smaller, memory compression techniques can enable an embedded system designer to pack more functionality in less space. Previous work on embedded memory compression has, in general, focused on compressing the instruction segment of executable code before execution and decompression at runtime. See, e.g., L. Benini et al., "Selective Instruction Compression for Memory Energy Reduction in Embedded Systems," IEEE/ACM Proc. of International Symposium on Lower Power Electronics and Design (IS-LPED '99), pages 206-11 (1999). Unfortunately, the inventors have recognized that solely compressing the instruction segment often does not produce sufficient memory savings to warrant the use of the additional compression hardware.

Thus, solutions currently available either do not handle code and data at the same time—or do not provide a workable solution in the embedded systems arena. Accordingly, there is a need for a unified architecture for embedded systems that can handle the compression of both code and data in a flexible and efficient manner.

SUMMARY OF INVENTION

The present invention is directed to a system architecture that can support compression of both instruction code and data in an efficient manner. In accordance with an embodiment of the invention, a buffer and a compression engine are interposed between any memory caches in a processor and main memory, the buffer storing one or more uncompressed frames having a size sufficiently large to be efficiently compressed by the compression engine and stored in compressed format in the main memory. Where there is a buffer miss, a compressed frame stored in the memory unit can be decompressed and placed in the buffer. The compressed frames of either code or data are advantageously substantially larger than traditional cache lines, large enough to allow for high levels of compression. The architecture can utilize a unified buffer for code or data or can utilize a separate buffer for code and a separate buffer for data. The architecture is advantageously independent of processor design or of the caching hierarchy utilized, if any. Moreover, any advantageous compression algorithm can be utilized, including separate compression algorithms for code and data.

In accordance with another aspect of the invention, memory fragmentation in main memory is addressed by compressing fixed size frames from the buffer and subdividing the compressed frames into a number of fixed-size subframes stored in random-access memory. Each subframe is preferably aligned on a fixed size boundary in the memory. The locations of each subframe of the compressed frame can be readily maintained in a mapping table. A structure of pointers can be used to keep track of free space in the random-access memory.

The present invention provides a flexible and unique design that, in particular, can work on a variety of embedded systems architectures. In accordance with another aspect of the invention, a design space exploration methodology is disclosed which advantageously allows a system designer to tune a variety of different parameters in the system to suit a particular application, including buffer size, frame size, subframe size, buffer miss policy, and compression algorithm.

The present invention can advantageously compress effectively both instruction code and data, and does not require memory caching to achieve fast compression speeds. The compression module advantageously can reside on a system where compression support is not available in any operating system. The architecture is also useful for testing different approaches to embedded code compression. Embedded systems incorporating the present invention can potentially require less memory while running more complex applications than possible in the prior art. This can result in higher quality systems with a lower cost. These and other advantages of the invention will be apparent to those of ordinary skill in the art by reference to the following detailed description and the accompanying drawings.

DETAILED DESCRIPTION

Figure 1:
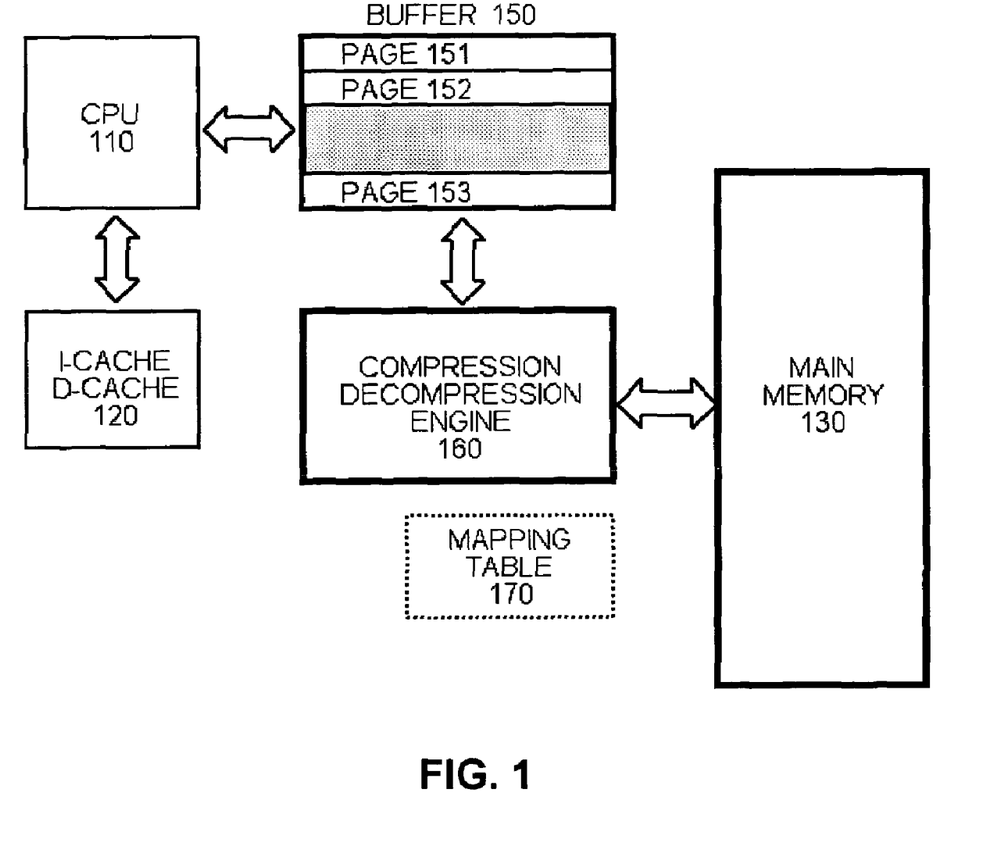
FIG. 1 shows the levels of memory hierarchy, in accordance with an embodiment of an aspect of the invention.

FIG. 1 is a diagram illustrating the various levels of memory hierarchy that can be used in a system built in accordance with an embodiment of an aspect of the invention. A central processing unit (CPU) 110 is shown in FIG. 1 which may or may not have one or more levels of caching 120. The cache(s) 120 can be an instruction and/or data cache. It should be noted that the memory compression architecture disclosed herein is advantageously independent of the particular CPU and caching hierarchy utilized. This approach does not require or assume any level of caching and can be readily implemented in a system without any cache. It is assumed for illustration that the system does not provide for virtual memory.

Existing architectures with multiple levels of memory hierarchy have typically been designed with a focus on performance. Given the significant performance overhead in compressing data in addition to code, it is generally beneficial to compress and decompress at levels of memory hierarchy that are as far away from the CPU. This, for example, is the approach taken in the above-mentioned prior art MXT architecture where compression happens between the L3 cache and main memory. In an embedded system, however, there are typically fewer layers of memory hierarchy (if any at all) which forces the system architecture designer to move compression/decompression closer to the CPU. Assuming the system incorporates a cache, a simple way of addressing memory compression would be to perform compression at the cache line level. Every time a cache miss happens, a compressed cache line would be fetched from memory, would be decompressed and placed in the cache. It has been recognized herein, however, that this approach does not work well in practice since the cache lines are typically too small to compress effectively. This is especially when cache lines are compressed without using any statistical information from other cache lines as it the case in this invention. For example, the inventors found that for a cache line of 32 bytes, size reductions are typically one to three percent of the original cache line size, while for a 64 byte cache line, compression ratios range between 5 and 10 percent of the original cache line size. These compression ratios do not give any substantial compression that would warrant the use of compression/decompression hardware. Note that small size cache lines could be compressed more effectively if global statistics were used; however in our case this is impractical as it makes our system non-universal and ties it to specific statistics of data that may actually not be found in other applications.

The present system, on the other hand, is designed with a focus on memory reduction, so that the compressed blocks can be substantially larger than the cache lines. As depicted in FIG. 1, and in accordance with an embodiment of an aspect of the invention, a buffer 150 is provided that holds one or more buffer lines 151, 152, 153, etc., of decompressed code or data, where the buffer line size is advantageously made large enough so as to allow for high levels of compression. The buffer 150 is interposed between the processor 110 and main memory 130.

It should be noted that although a single unified buffer 150 is depicted in FIG. 1 for code and data, the present invention is not so limited. As further discussed herein, alternative embodiments include having a separate buffer for code and a separate buffer for data.

The buffer lines 151, 152, 153 in the buffer 150 store frames of data which are in a decompressed format and are compressed using a compression engine 160 before storage in main memory 130. The buffer 150 maintains a mechanism for tracking the status of the buffer lines 151, 152, 153. For example, each buffer line 151, 152, 153 can contain what is referred to in the art as a "dirty" bit, which indicates whether the buffer line has been modified and whether a write-back is needed. The dirty bit is set whenever there is some new data inserted in the buffer 150. The dirty data need not be compressed and written back to memory 130 unless there is new data that needs to be refilled and the old data must be rewritten back in memory 130. When a buffer "miss" occurs, a compressed frame is retrieved from memory 130, decompressed using the decompression engine 160 and placed in one or more buffer lines in the buffer 150. When a new buffer line needs to be occupied in the buffer 150, it may be necessary to evict the contents of an existing buffer line. It is advantageous to utilize some replacement policy to decide which buffer line to evict. For example and without limitation, a replacement policy such as "round robin" and a "least recently used" (LRU) replacement policy can be utilized.

MEMORY MANAGEMENT. Memory management presents two distinct challenges: locating compressed data during reads, and finding a free location to store newly compressed data during writes. It is important to split data areas into frames (also referred to as blocks or pages in the art) and provide random access at the frame level. Providing random access at the byte or even word level results in huge memory requirements to store memory management information and is not feasible.

Accordingly, the data space is advantageously divided into a number of frames which are referred to herein as "pages." The pages refer to a fixed number of bytes in main memory that are compressed individually. Typically, the page size is equal to the buffer line, as depicted in FIG. 1, although in general it can be a multiple of the buffer line. The pages preferably have a size ranging from 1 Kbyte to 16 Kbytes. Splitting data into smaller pages than 1 KB proves to be ineffective in terms of achieving substantial compression ratios. For illustration purposes, it is assumed herein that the page size is 1 KB.

After compression, each compressed page will occupy less space than the original page. In the rare event where compression cannot yield any size reduction, pages can be stored in their original form Thus, in the general case, a 1 KB page will compress to any size less than or equal to 1 KB. This variable size can complicate indexing compressed pages significantly. In accordance with an embodiment of another aspect of the invention, it is advantageous to subdivide the page into groups of what the inventors refer to as "CFRAMES". CFRAMES represent the smallest addressable unit in compressed memory. Compressed pages are represented as multiples of the CFRAME size. Smaller CFRAME sizes result in reduced memory fragmentation; however, smaller CFRAME sizes also result in a larger mapping table. For illustration purposes, a 1 KB page is advantageously divided into 16 CFRAMEs, each CFRAME having a size set to 64 bytes.

Moreover, a rule is imposed on block alignment of each CFRAME. For example, for the CFRAMES set to 64 bytes, all CFRAMES are aligned on a 64-byte boundary.

Figure 2:
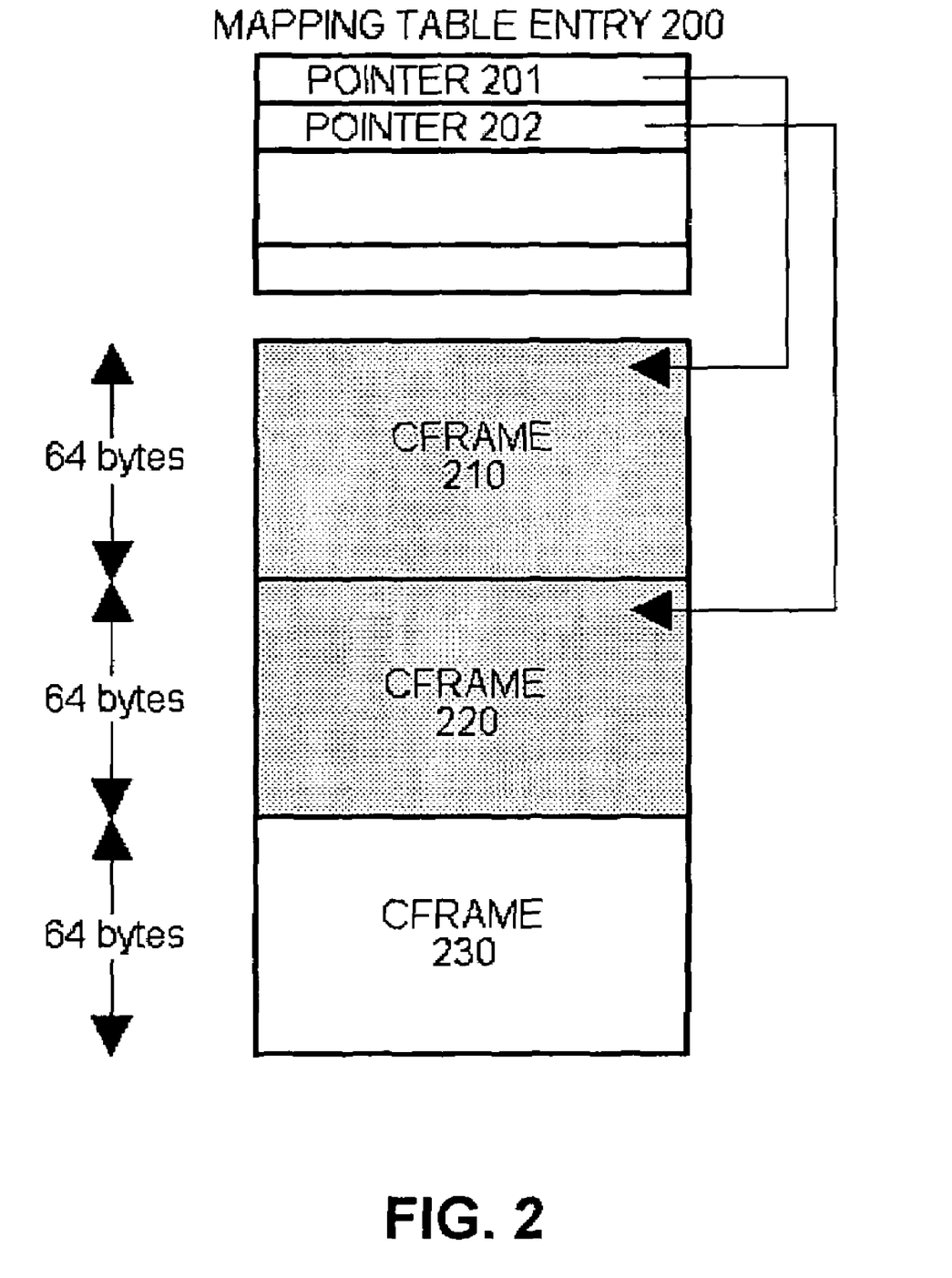
FIG. 2 is an abstract diagram of the memory mapping data structure.

In FIG. 2, a table for mapping compressed pages in memory is depicted. Each table entry 200 corresponds to a compressed page and it stores the locations of 16 CFRAMES. The memory locations can be represented as bit pointers, 201, 202, etc., each pointer pointing to a 64-bit boundary, since the CFRAMEs are aligned on 64-bit boundaries. By allocating space for 16 blocks per page, it is ensured that any page can be stored in the table regardless of compression ratio. An additional advantage is that the mapping table has a fixed size and, therefore, can be easily indexed, e.g., by the first bits of the page pointer. Thus, the mapping table provides a means for finding a compressed page in memory. Note that the mapping table can be stored in memory along with the compressed data. (An alternative would be to save space for pages that compress well and not allocate the space for the 16 CFRAME pointers. This, however, would complicate the design as the table would not have fixed-size entries and indexing it would be more difficult.)

Figure 3:
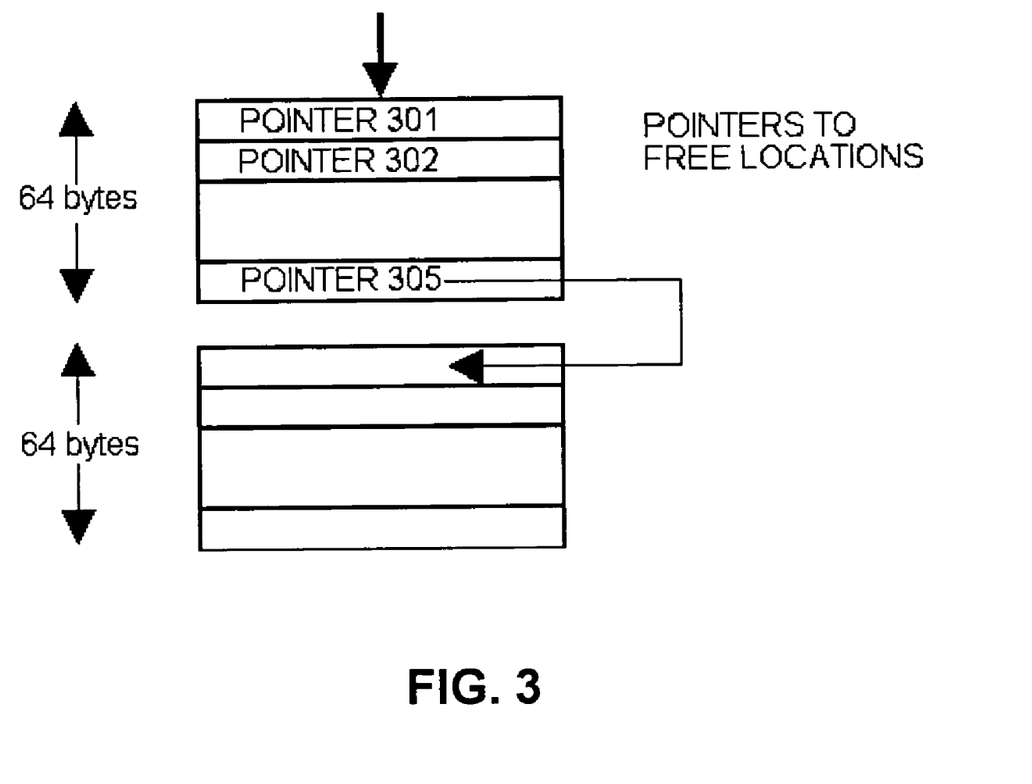
FIG. 3 is an abstract diagram of the free space management data structure.

A structure is needed to help locate free space during writes when attempting to write a page back to memory. FIG. 3 illustrates such a structure. The structure depicted in FIG. 3 comprises a series of pointers pointing to free space. It works as a FIFO and it can be blocked in chunks of 64 bytes. Each chunk, which consists of pointers to free locations, takes 64 bytes, and, thus, can be considered as a free 64-byte block itself.

COMPRESSION ALGORITHM. The present invention is advantageously not limited to any particular compression/decompression algorithm. A designer can readily plug-in any advantageous compression IP in the context of the present architecture.

It should be noted that executable code compression is a complex problem that is different from regular data compression This is because embedded systems typically require partial decompression of the compressed data during runtime due to space constraints. Since executables do not execute in a sequential manner, random access decompression is required. Data presents new challenges when selecting a compress/decompression algorithm. In addition to the random access requirement of code compression, an additional difficulty with data is that it can be written back to memory; therefore, fast compression and memory management techniques are required.

Thus, it is preferable that the compression algorithm provide for fast compression/decompression in hardware, that it take up a small hardware area, and that it provide for random access compression/decompression at the buffer size level. Given a page size of 1024, it is preferable that the algorithm compress well 1 KB of data. It should be noted that for many data compression algorithms, this is not enough data to collect a significant amount of statistics. The inventors have found that one of the best performing algorithms that satisfies these requirements is a dynamic dictionary technique that matches input bytes with values in a table called a dictionary in combination with a technique called run-length encoding. For explanations on dictionary techniques and run-length encoding see T. C. Bell and J. G. Cleary and I. H. Witten, "Text Compression,", Prentice Hall (1990), which is incorporated by reference herein. Dictionary techniques are particularly suited for hardware implementations, and the inventors found such techniques to be the fastest and least memory consuming as well. Alternatively, and without limitation, other compression techniques can be utilized, such as versions of dynamic Markov compression, which are particularly strong when compressing binary data.

DESIGN EXPLORATION. The architectural design has the flexibility to be useful as a platform for testing different approaches to embedded code compression. It is advantageous to define a variety of configurable parameters which can be readily modified. Using the following illustrative parameters, a designer can readily tune the system to a particular application:

a. Compression IP: The present design allows a designer to "plug-in" any compression/decompression algorithm and simulate it. Only an executable is necessary for the compression/decompression algorithm, as a simulation environment can be used to run it as an external program.

b. Separate compression software for code and data. Compression of code areas does not necessarily need to use identical techniques for compression of data areas. Data needs to be written as well and often requires different compression strategies. For code it is possible to built a global compression model since code will not change throughout the execution of the program. Using this global compression model, compression can occur at the page level where each page can be compressed/decompressed independently. This gives the power to use statistics from the whole code segment. On the other hand, such a strategy is not possible for data, where a global compression model is meaningless since data changes during execution.

c. Buffer size. The designer can easily modify the buffer size. A small buffer size will generally require less area. Smaller buffers, however, will incur more page misses and, therefore, deteriorate performance. Therefore, there is an area/performance tradeoff that can be easily explored using the present platform.

d. Page size. Page size is another important parameter that can be modified. A smaller page size makes compression of code and especially data difficult. This is true for data more than code, since, as mentioned above, a global compression model cannot be built for data and, therefore, compression/decompression of the page has to be done completely independently from the rest. By setting the page size to smaller values, there is often not enough statistical information in one page to compress_effectively. The page size, however, cannot be arbitrarily large. The page size must be less than or equal to the buffer size and not made too large where it imposes serious miss penalties.

e. CFRAME size. The CFRAME parameter affects mainly memory fragmentation. The present platform makes it easy to modify this parameter.

f. Buffer miss policy. Buffer lines are replaced (evicted) during buffer misses when the dirty buffer line bit is set. The platform can be readily adapted to support different buffer miss/replacement policies. For example and without limitation, the platform could support a "round robin" policy: when a new buffer line must be brought into the buffer, a buffer line is chosen to be evicted in a circular fashion, typically using a wrap-around counter to determine which buffer line should be evicted. The platform could support a "least recently used" (LRU) policy: a timestamp is kept for every time a buffer line is requested by the cache; when eviction is required, the least recently used (oldest timestamp) is chosen.

g. Unified and separate buffers. Code and data exhibit different locality. This can be better exploited by providing two separate buffers, one for code and one for data. The platform permits using a unified buffer as well as two separate buffers.

h. CPU independent. Any CPU can be plugged into the architecture. This allows experimentation with different instruction set architectures. Note that the compression/decompression technology is completely CPU independent.

Figure 4:
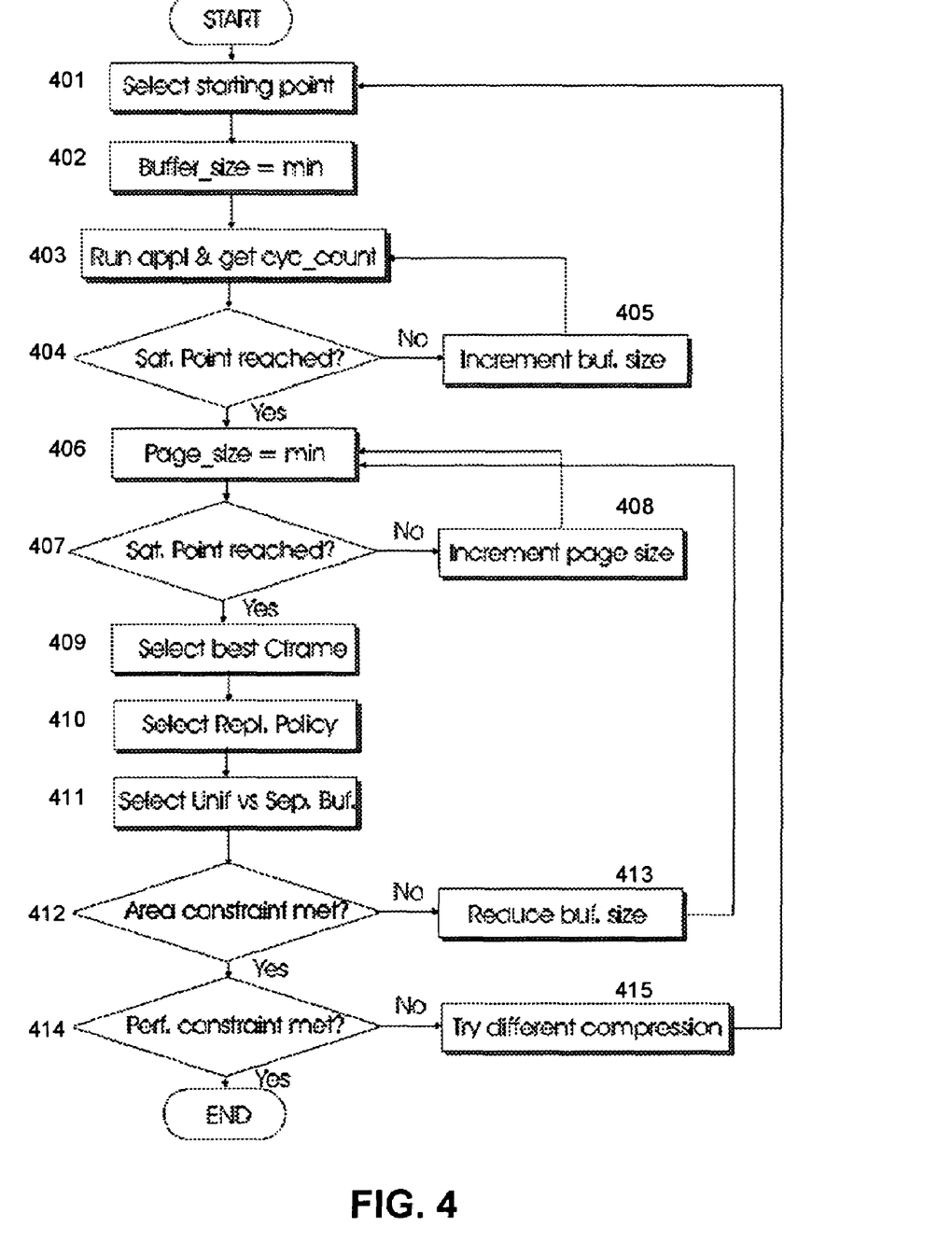
FIG. 4 is a flowchart of a design exploration methodology, in accordance with an embodiment of another aspect of the invention

FIG. 4 is a flowchart of a design space exploration methodology, in accordance with an embodiment of this aspect of the invention. The goal of the exploration is to optimize an application in terms of performance and area. The following metrics are useful to track so as to evaluate the area overheads and the performance of the system:

Cycle count: This measures the total number of cycles which gives system performance.

Fragmentation: This is a measure of unused space in memory pages.

Buffer miss ratio: The buffer miss ratio is an indirect measure of performance.

Number of page write backs: Write backs refer to how many times a compression algorithm had to compress data before writing to main memory. This number shows how much compression was necessary during runtime.

Number of page reads. This is directly related to the buffer miss ratio and shows how many times decompression of a page was performed.

After choosing a CPU suitable for the embedded environment, the design space exploration can proceed as follows:

1. Compilation. The application is compiled for the chosen processor.

2. Application compression. The application is compressed; both data areas and code areas are stored in compressed format.

3. Free space allocation. Besides the compressed code and data areas, it is necessary to allocate some free space for data will be written during the application. The inventors have found based on simulation experiments that more than 50% compression is an attainable goal. However, since an application will behave differently depending on the input that is fed to it, it is not always possible to know a priori what will be the free space requirement. For this reason, it is advantageous to take a conservative estimate and allow for enough free space so that the compressed executable and the free space combined is about 50% of the original application. This is chosen for applications with large data areas. Applications with small data areas do not compress as effectively; on the other hand, they typically have fewer writes. Therefore, in most cases allocating 50% of the original space is a reasonable choice. In some cases running the application with many types of different data will give a better idea of what the space requirements are.

4. Pick parameters—starting point. A starting point for all parameters should be selected: e.g., buffer size, page size, CFRAME size, buffer replacement policy, and unified or separate buffer(s).

5. Parameter tuning. At this step, the parameters are changed and go back to step 3. The procedure described is illustrated by the flowchart shown in FIG. 4. The parameters can be modified as follows:

(a) Buffer size. The buffer size affects miss ratio and area. Clearly a larger buffer will have the lowest miss ratio, and thus the higher performance. However, this will affect adversely the total area of the system. In FIG. 4, the best size is picked where performance appears not to improve substantially from the next large size (performance saturation point).

(b) Page size. The page size affects primarily compression ratios and secondarily performance. The page size is picked that gives the best compression ratio.

(c) CFRAME size. The CFRAME size affects memory fragmentation mainly, which has a small effect on compression. There is no substantial effect on performance. The CFRAME size that minimizes fragmentation is chosen.

(d) Buffer replacement policy. This affects performance only. The policy is selected that has the best performance in terms of total number of cycles.

(e) Unified buffer v. separate buffers. A unified buffer for both code and data can be experimented with and compared with the performance with two buffers, one for code and one for data. The best performing of the two choices can then be selected.

(f) Final step—constraints met? At this step, the constraints can be evaluated, e.g., area and performance. If area is violated, we go back and reduce the buffer size. If there is a performance violation, a different compression algorithm can be selected and the procedure can start over from the beginning.

The design methodology notably could also be modified to take into account other constraints, such as power consumption, as would be understood by one of skill in the art. It is advantageous to implement the methodology using a processor simulator which can be customized to include various levels of memory hierarchy and any other custom device that may interact with the CPU or memory modules.

The above implementation is merely illustrative of the invention. It will be understood by those of ordinary skill in the art that various changes may be made that are within the scope of the invention, which is to be limited only by the appended claims.

What is claimed is:

1. A system comprising:

a processor;

a random access memory adapted to store a plurality of frames, wherein each frame is subdivided into a fixed number of subframes, and wherein a mapping table is used to associate each frame with locations in the memory of the fixed number of subframes; and a buffer and compression engine interposed between the memory and any caches in the processor, the buffer storing one or more uncompressed frames, said uncompressed frames having a size sufficiently large to be efficiently compressed by the compression engine and at least a portion of which is stored in compressed format in the memory, wherein the compression engine is adapted to compress a fixed size frame into a variable length compressed frame, and wherein each variable length compressed frame is stored in a number of subframes that is equal to or less than the fixed number of subframes and indexed using the mapping table.

2. The system of claim 1 wherein, if there is a buffer miss, a compressed frame stored in the memory can be decompressed by a decompression engine and placed in the buffer.

3. The system of claim 1 wherein the buffer is a unified buffer that stores both uncompressed code and uncompressed data.

4. The system of claim 1 wherein the buffer further comprises multiple buffer lines having a first separate buffer for uncompressed code and a second separate buffer for uncompressed data.

5. The system of claim 4 wherein the compression engine uses a different compression algorithm for compressing code and for compressing data.

6. The system of claim 1 wherein the compression engine subdivides each compressed frame into a plurality of fixed size subframes stored in the memory.

7. The system of claim 1 wherein the compression engine uses a dictionary-based algorithm and incorporates run-length encoding.

8. The system of claim 1 wherein the system is an embedded system.

9. An embedded system architecture comprising:

random-access memory which is adapted to store a plurality of frames, wherein each frame is subdivided into a fixed number of subframes and wherein a mapping table is used to associate each frame with locations in memory of the fixed number of subframes; and, a compressor coupled to the memory which is adapted to compress a fixed size frame into a variable length compressed frame wherein each variable length com pressed frame is stored in a number of subframes that is equal to or less than the fixed number of subframes and indexed using the mapping table.

10. The embedded system architecture of claim 9 wherein a frame can contain instruction code or data.

11. The embedded system architecture of claim 9 wherein each subframe is aligned on a fixed size boundary in the memory.

* * * * *